(12) United States Patent
Kestler et al.

(10) Patent No.: US 10,687,422 B2
(45) Date of Patent: Jun. 16, 2020

(54) DUAL-SIDED FPC ASSEMBLY AND RELATED SYSTEMS AND METHODS FOR HOTBAR SOLDERING FPC ASSEMBLIES

(71) Applicant: Google LLC, Mountain View, CA (US)

(72) Inventors: Jordan Andrew Kestler, Pacifica, CA (US); Daniel Thomas Berg, Gilroy, CA (US); Livius Dimitrie Chebeleu, San Jose, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 16/470,045

(22) PCT Filed: Sep. 20, 2017

(86) PCT No.: PCT/US2017/052375
§ 371 (c)(1),
(2) Date: Jun. 14, 2019

(87) PCT Pub. No.: WO2018/111367
PCT Pub. Date: Jun. 21, 2018

(65) Prior Publication Data
US 2019/0357356 A1 Nov. 21, 2019

Related U.S. Application Data

(60) Provisional application No. 62/435,205, filed on Dec. 16, 2016.

(51) Int. Cl.
*H05K 1/11* (2006.01)
*H05K 3/34* (2006.01)

(52) U.S. Cl.
CPC .......... *H05K 1/118* (2013.01); *H05K 3/3405* (2013.01); *H05K 2201/10287* (2013.01); *H05K 2201/2009* (2013.01)

(58) Field of Classification Search
CPC ...... H01R 12/592; H01R 4/024; H01R 4/023; H01R 13/665; H01R 13/6658;
(Continued)

(56) References Cited

U.S. PATENT DOCUMENTS 4,490,690 A * 12/1984 Suzuki .................... H01P 3/085
174/117 FF
6,241,141 B1 6/2001 Al-Nabulsi
(Continued)

FOREIGN PATENT DOCUMENTS

CN 101146402 3/2008
CN 101170870 4/2008
(Continued)

OTHER PUBLICATIONS

International Search Report and Written Opinion for PCT/US2017/052375, dated Apr. 1, 2018, 2 pages.
(Continued)

*Primary Examiner* — Roshn K Varghese
(74) *Attorney, Agent, or Firm* — Lerner, David, Littenberg, Krumholz & Mentlik, LLP (57) ABSTRACT

A flexible printed circuit assembly may include a flexible circuit body having a first side and an opposed second side. The circuit body may define first and second soldering areas along the first and second sides of the flexible circuit body, respectively. The first soldering area may include a first set of solder pads and the second soldering area may include a second set of solder pads. The assembly may also include a first stiffening member secured to the second side of the circuit body and a second stiffening member secured to the first side of the circuit body. The first stiffening member may be laterally aligned with the first set of solder pads defined on the first side of the circuit body and the second stiffening
(Continued)

member may be laterally aligned with the second set of solder pads defined on the second side of the circuit body.

18 Claims, 9 Drawing Sheets

(58) Field of Classification Search
CPC .......... H01R 13/6666; H01R 43/0256; H05K 1/118; H05K 1/021; H05K 1/0212; H05K 1/0213; H05K 1/0215; H05K 1/0216; H05K 1/0218; H05K 1/0219; H05K 1/0281; H05K 1/0278; H05K 1/028; H05K 1/0271; H05K 1/0277; H05K 2201/05; H05K 2201/051; H05K 2201/052; H05K 2201/053; H05K 2201/055; H05K 2201/056; H05K 2201/057; H05K 2201/058; H05K 3/3405
See application file for complete search history.

(56) References Cited

U.S. PATENT DOCUMENTS

| | | | |
|---|---|---|---|
| 8,905,793 B2 | 12/2014 | Golko et al. | |
| 9,084,357 B2* | 7/2015 | Shedletsky | G06F 1/1643 |
| 2001/0001464 A1* | 5/2001 | Godwin | B23K 1/002 |
| | | | 219/603 |
| 2003/0095389 A1 | 5/2003 | Samant et al. | |
| 2005/0143659 A1 | 6/2005 | Saiga | |
| 2006/0279371 A1* | 12/2006 | Sato | H05K 1/0219 |
| | | | 333/1 |
| 2007/0134945 A1* | 6/2007 | Kataoka | H05K 1/0281 |
| | | | 439/34 |
| 2009/0008131 A1 | 1/2009 | Shibata et al. | |
| 2009/0277665 A1* | 11/2009 | Kumamoto | H01R 9/035 |
| | | | 174/113 R |
| 2012/0184130 A1* | 7/2012 | Yaguchi | H01R 12/53 |
| | | | 439/493 |
| 2013/0163210 A1 | 6/2013 | Sandford et al. | |
| 2014/0125884 A1 | 5/2014 | Wang | |
| 2014/0191457 A1 | 7/2014 | Sharma et al. | |
| 2015/0289362 A1* | 10/2015 | Tanaka | H05K 1/0219 |
| | | | 174/262 |
| 2015/0349465 A1* | 12/2015 | Cornelius | H01R 13/665 |
| | | | 439/620.22 |

FOREIGN PATENT DOCUMENTS

| | | |
|---|---|---|
| CN | 203104954 U | 7/2013 |
| CN | 206451952 | 8/2017 |
| CN | 208258175 | 12/2018 |
| EP | 1090706 | 11/2001 |
| EP | 2731411 | 5/2014 |
| JP | 2014081465 | 8/2014 |
| JP | 2014145843 | 8/2014 |

OTHER PUBLICATIONS

International Preliminary Report on Patentability for PCT/US2017/052375, dated Dec. 7, 2018, 21 pages.

Notification of the Second Office Action for Chinese Patent Application No. 201710905628.X dated Mar. 3, 2020. 10 pages.

* cited by examiner

DUAL-SIDED FPC ASSEMBLY AND RELATED SYSTEMS AND METHODS FOR HOTBAR SOLDERING FPC ASSEMBLIES

PRIORITY CLAIM

The present application is based upon and claims the right of priority under 35 U.S.C. § 371 to International Application No. PCT/US2017/052375, filed Sep. 20, 2017, which claims the benefit of U.S. Provisional Application Ser. No. 62/435,205, filed Dec. 16, 2016. Applicant claims priority to and the benefit of each of such applications and incorporate all such applications herein by reference in their entirety.

FIELD

The subject matter relates generally to hotbar soldering flexible printed circuit (FPC) assemblies and, more particularly, to a dual-sided, FPC assembly and a related soldering fixture for hotbar wires to the FPC assembly.

BACKGROUND

Consumer electronic devices, such as smartphones and other portable electronic devices, have become increasingly popular over the past several years. In a competitive market, continuous improvements and enhancements must be made to electronic devices to satisfy the increasing consumer demands regarding the performance and/or functionality of such devices. However, despite consumer demands for increased performance and/or functionality, consumer expectations still require that portable electronic devices remain relatively small in size. As such, design considerations and manufacturing techniques for portable electronic devices must take into account the desire for increased performance and/or functionality while balancing consumer expectations in relation to the size of such devices.

One relevant consideration is the design and manufacture of flexible printed circuit (FPC) assemblies. Specifically, in many instances, it is desirable to hotbar solder all of the external wires to the flexible circuit body of a FPC assembly. However, conventional designs and manufacturing techniques for FPC assemblies often do not allow for hotbar soldering of all of the wires. For instance, hotbar soldering typically requires a minimum pitch between solder pads for the hotbar fixture. Unfortunately, for smaller flexible circuit bodies, it is often not possible to provide the minimum required pitch without staggering the solder pads in rows along a given side of the circuit body. In such instances, at least one set of wires of a given FPC assembly must be hand soldered to the flexible circuit body, which is an inefficient and/or time consuming process.

SUMMARY

Aspects and advantages of embodiments of the invention will be set forth in part in the following description, or may be obvious from the description, or may be learned through practice of the embodiments.

In one aspect, the present subject matter is directed to a flexible printed circuit assembly. The flexible printed circuit assembly may include a flexible circuit body having a first side and an opposed second side. The flexible circuit body may define a first soldering area along the first side of the flexible circuit body and a second soldering area along the second side of the flexible circuit body. The first soldering area may include a first set of solder pads and the second soldering area may include a second set of solder pads. The flexible printed circuit assembly may also include a first stiffening member secured to the second side of the flexible circuit body and a second stiffening member secured to the first side of the flexible circuit body. The first stiffening member may be laterally aligned with the first set of solder pads defined on the first side of the flexible circuit body and the second stiffening member may be laterally aligned with the second set of solder pads defined on the second side of the flexible circuit body.

In another aspect, the present subject matter is directed to a system for hotbar soldering flexible printed circuit assemblies. The system may include a soldering fixture defining a support surface and a recessed channel that is recessed relative to the support surface. The system may also include a flexible circuit body having a first side and an opposed second side. The flexible circuit body may define a first soldering area along the first side of the flexible circuit body and a second soldering area along the second side of the flexible circuit body. The first soldering area may include a first set of solder pads and the second soldering area may include a second set of solder pads. The system may also include a first set of wires secured to the flexible circuit body at the first set of solder pads and a second set of wires secured to the flexible circuit body at the second set of solder pads. When the flexible circuit body is supported on the support surface of the soldering fixture such that the first side of the flexible circuit body faces towards the support surface and the second side of the flexible circuit body faces away from the support surface, the first set of wires may be received within the recessed channel of the soldering fixture.

In a further aspect, the present subject matter is directed to a method for hotbar soldering flexible printed circuit assemblies. The method may include positioning a flexible circuit body on a support surface of a soldering fixture such that a first side of the flexible circuit body faces away from the support surface and a second side of the flexible circuit body faces towards the support surface, wherein the soldering fixture defines a recessed channel that is recessed relative to the support surface. The method may also include aligning ends of a first set of wires with a corresponding first set of solder pads provided on the first side of the flexible circuit body and compressing the ends of the first set of wires and the flexible circuit body between a thermode and the support surface while thermal energy is transferred from the thermode to the first set of wires and the first set of solder pads to secure the first set of wires to the first side of the flexible circuit body at the first set of solder pads. In addition, the method may include flipping the flexible circuit body relative to the soldering fixture such that the second side of the flexible circuit body faces away from the support surface and the first side of the flexible circuit body faces towards the support surface and aligning the flexible circuit body relative to the soldering fixture such that the first set of wires is received within the recessed channel while a portion of the flexible circuit body is being supported by the support surface of the soldering fixture.

Other exemplary aspects of the present subject matter may be directed to other flexible printed circuit assemblies, systems, methods, apparatus, and/or the like.

These and other features, aspects and advantages of the various embodiments will become better understood with reference to the following description and appended claims. The accompanying drawings, which are incorporated in and constitute a part of this specification, illustrate embodiments of the invention and, together with the description, serve to explain the related principles.

BRIEF DESCRIPTION OF THE DRAWINGS

Detailed discussion of embodiments directed to one of ordinary skill in the art, are set forth in the specification, which makes reference to the appended figures, in which.

DETAILED DESCRIPTION

Reference now will be made in detail to embodiments, one or more examples of which are illustrated in the drawings. Each example is provided by way of explanation of the embodiments, not limitation. In fact, it will be apparent to those skilled in the art that various modifications and variations can be made to the embodiments without departing from the scope or spirit of the embodiments. For instance, features illustrated or described as part of one embodiment can be used with another embodiment to yield a still further embodiment. Thus, it is intended that the present subject matter cover such modifications and variations as come within the scope of the appended claims and their equivalents.

In general, the present subject matter is directed to a dual-sided, flexible printed circuit (FPC) assembly and related systems and methods for manufacturing such assemblies using a hotbar soldering process. As will be described below, the flexible circuit body of an FPC may be designed to include sets of solder pads on opposed sides of the body, with the set of solder pads on one side of the circuit body being laterally offset from the set of solder pads on the opposed side of the circuit body. Additionally, a stiffening member may be provided in association with each set of solder pads, with the stiffening member being laterally aligned with its corresponding set of solder pads along the opposed side of the circuit body. Each stiffening member may generally be configured to provide additional structural integrity to the FPC when a set of external wires are being hotbar soldered to the associated set of solder pads.

Moreover, in several embodiments, the disclosed FPC assembly may be hotbar soldered using a soldering fixture that defines a recessed channel relative to its upper support surface. In such embodiments, the FPC assembly may be supported on the support surface of the fixture when hotbar soldering a set of external wires to the solder pads provided on one side of the flexible circuit body. Thereafter, the circuit body may be flipped over and placed relative to the fixture such that the previously soldered wires are received within the recessed channel, thereby allowing a second set of external wires to be hotbar soldered to the solder pads provided on the opposed side of the flexible circuit body.

Figure 1A:
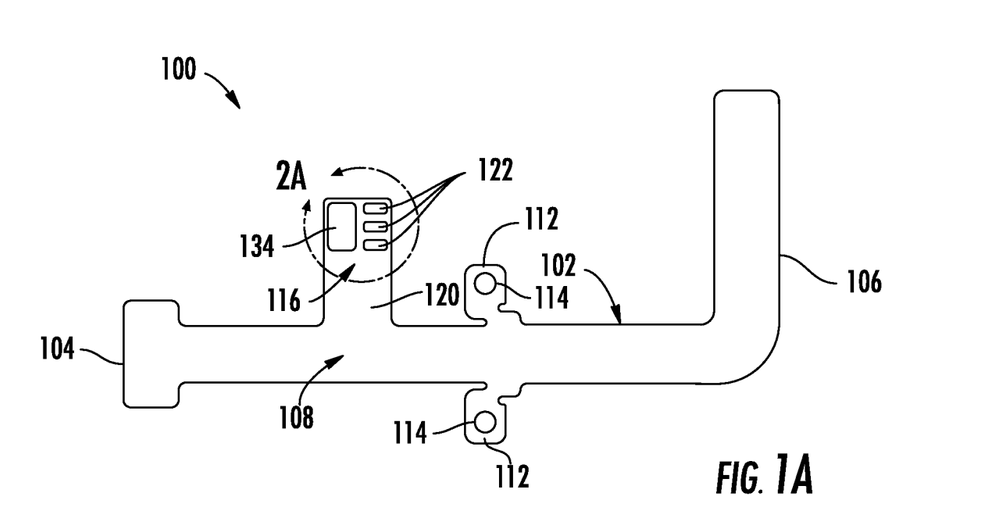
FIG. 1A illustrates a view of one side of a dual-sided flexible printed circuit in accordance with aspects of the present subject matter.
Figure 1B:
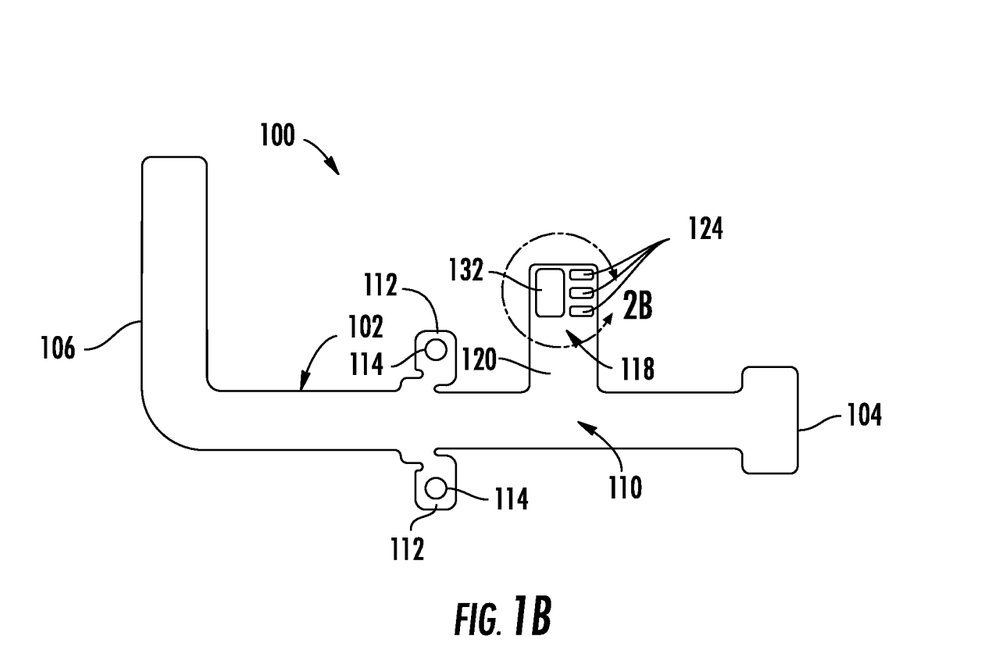
FIG. 1B illustrates a view of the opposed side of the flexible printed circuit shown in FIG. 1A.
Figure 2A:
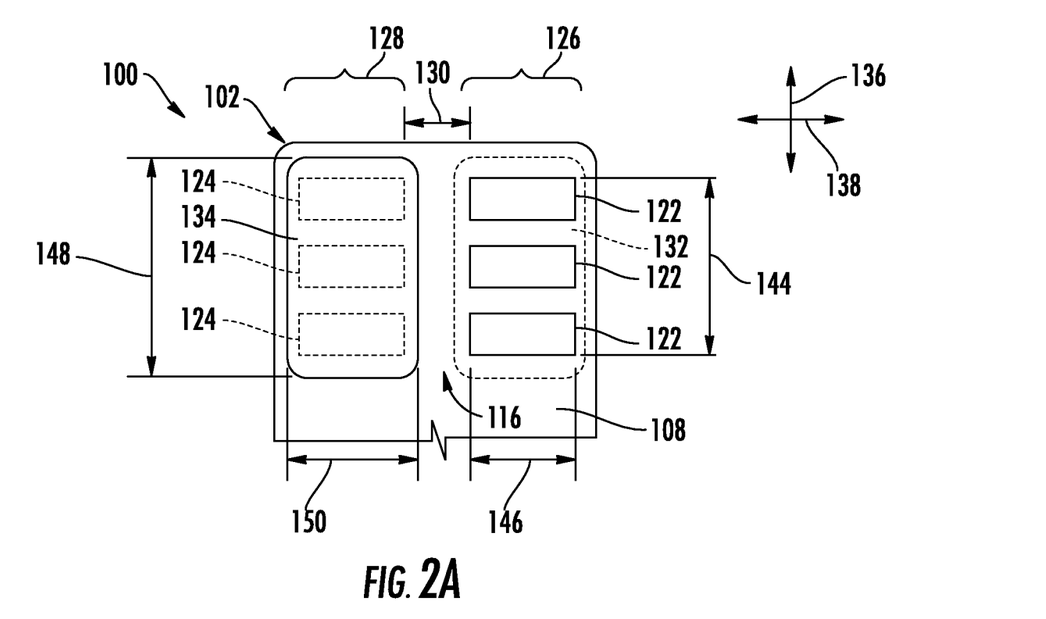
FIG. 2A illustrates a partial view of the side of the flexible printed circuit shown in FIG. 1A.
Figure 2B:
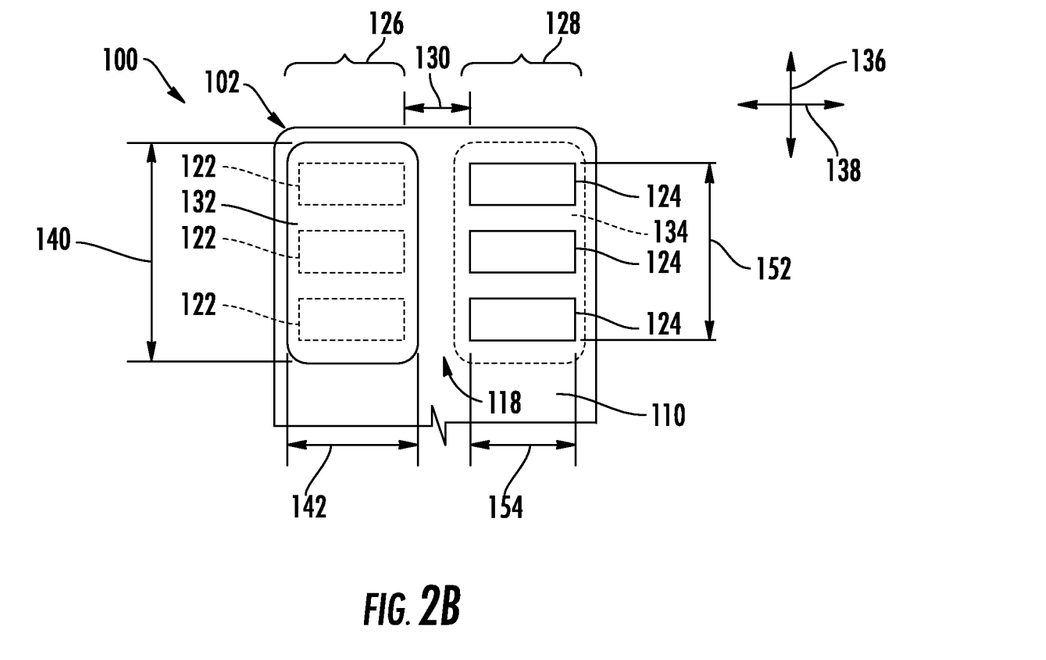
FIG. 2B illustrates a partial view of the side of the flexible printed circuit shown in FIG. 1B.

Referring now to the drawings, FIGS. 1A-2B illustrate various views of one embodiment of a dual-sided, flexible printed circuit (FPC) 100 in accordance with aspects of the present subject matter. Specifically, FIG. 1A illustrates a view of one side of the FPC 100 and FIG. 1B illustrates a view of the opposed side of the FPC 100. Additionally, FIG. 2A illustrates a view of a portion of the side of the FPC 100 shown in FIG. 1A and FIG. 2B illustrates a view of a portion of the side of the FPC 100 shown in FIG. 1B.

As shown in the illustrated embodiment, the FPC 100 may generally include a circuit body 102 extending lengthwise between a first end 104 and a second end 106. In addition, the circuit body 102 may include a first face or side 108 (FIGS. 1A and 2A) extending between the first and second ends 104, 106 and an opposed, second face or side 110 (FIGS. 1B and 2B) extending between the first and second ends 106, 108. Moreover, the circuit body 102 may include one or more areas or features for coupling the circuit body 102 to another component. For instance, the circuit body 102 may include mounting tabs 112 defining openings 114 for mounting the circuit body 102 to a given component (e.g., the frame or base of a consumer electronic device)

It should be appreciated that the circuit body 102 may generally be formed from any suitable materials and/or may generally have any suitable configuration that allows it to form part of the disclosed FPC 100. For instance, in several embodiments, the circuit body 102 may correspond to a laminate structure formed from two or more layers of a flexible base material (e.g., a flexible polymer film) having a plurality of internal conductors (e.g., metal foils conductors) positioned between the layers. Additionally, it should be appreciated that the circuit body 102 may generally be configured to define any suitable shape, depending primarily on the intended application for the FPC 100. For instance, the specific shape of the circuit body 102 shown in the illustrated embodiment simply provides a single example of a suitable shape for a circuit body of a FPC.

Referring still to FIGS. 1A-2B, the disclosed FPC 100 may also include one or more areas or features for coupling external conductors (e.g., wires) to the circuit body 102. For instance, as shown in the illustrated embodiment, the FPC 100 may include both a first soldering area 116 defined on the first side 108 of the circuit body 102 and a second soldering area 118 defined on the second side 110 of the circuit body 102. As shown in FIGS. 1A-2B, the soldering areas 116, 118 are defined on a common soldering arm 120 (FIGS. 1A and 1B) of the circuit body 102. However, in other embodiments, the soldering areas 116, 118 may be defined at any other suitable location on the circuit body 102. Additionally, in several embodiments, the FPC 100 may include one or more solder pads 122, 124 positioned on the circuit body 102 within each soldering area 115, 118. Specifically, as shown in FIG. 2A, the FPC 100 may include a first set of solder pads 122 positioned on the first side 108 of the circuit body 102 within the first soldering area 116. Similarly, as shown in FIG. 2B, the FPC 100 may include a second set of solder pads 124 positioned on the second side 110 of the circuit body 102 within the second soldering area 118.

It should be appreciated that, in general, the FPC 100 may include any number of solder pads 122, 124 within each soldering area 116, 118 of the circuit body 102. For instance, in the illustrated embodiment, the FPC 100 includes three individual solder pads located within each soldering area 116, 118. However, in other embodiments, the FPC 100 may include less than three solder pads within each soldering area 116, 118 or greater than three solder pads within each soldering area 116, 118.

As particularly shown in FIGS. 2A and 2B, the differing sets of solder pads 122, 1124 provided on the opposed sides 108, 110 of the circuit body 102 may be configured to be laterally offset from each other. Specifically, as shown in the illustrated embodiment, the first set of solder pads 122 may be provided along a first lateral portion 126 of the soldering areas 116, 118 and the second set of solder pads 124 may be provided along a second lateral portion 128 of the soldering areas 1116, 118. As such, a minimum lateral offset distance 130 may be defined between the first set of solder pads 126 and the second set of solder pads 128.

Additionally, in several embodiments, the FPC 100 may include a pair of stiffening members 132, 134 coupled to the opposed sides 108, 110 of the circuit body 102, with each stiffening member 132, 134 being provided in association with one of the set of solder pads 122, 124. Specifically, the FPC 100 may include a first stiffening member 132 configured to be secured to the second side 110 of the circuit body 102 within the first lateral portion 126 of the soldering areas 116, 118 such that the first stiffening member 132 is laterally aligned with the first set of solder pads 122 provided on the opposite, first side 108 of the circuit body 102. For instance, as shown in FIG. 2B, the first stiffening member 132 may be configured to extend across the first lateral portion 126 defined along the second side 110 of the circuit body 102 in both a first lateral direction (e.g., indicated by arrow 136) and a second lateral direction (e.g., indicated by arrow 138) so as to span across the corresponding area covered by the first set of solder pads 122 along the first side 108 of the circuit body 102. Specifically, as shown in FIGS. 2A and 2B, the first stiffening member 132 may define first and second lateral dimensions 140, 142 (FIG. 2B) in the first and second lateral directions 136, 138, respectively, that are greater than corresponding first and second lateral dimensions 144, 146 (FIG. 2A) collectively defined by the area encompassing the first set of solder pads 122, 124. As such, the first stiffening member 132 may be configured to provide structural integrity to the FPC 100 when a corresponding set of external wires are being hotbar soldered to the first set of solder pads 122.

Similarly, the FPC 100 may include a second stiffening member 134 configured to be secured to first side 108 of the circuit body 102 within the second lateral portion 128 of the soldering areas 116, 118 such that the second stiffening member 134 is laterally aligned with the second set of solder pads 124 provided on the opposite, second side 110 of the circuit body 102. For instance, as shown in FIG. 2B, the second stiffening member 134 may be configured to extend across the second lateral portion 128 defined along the first side 108 of the circuit body 102 in both the first lateral direction 136 and the second lateral direction 138 so as to span across the corresponding area covered by the second set of solder pads 124 along the second side 110 of the circuit body 102. Specifically, as shown in FIGS. 2A and 2B, the second stiffening member 134 may define first and second lateral dimensions 148, 150 (FIG. 2A) in the first and second lateral directions 136, 138, respectively, that are greater than corresponding first and second lateral dimensions 152, 154 (FIG. 2B) collectively defined by the area encompassing the second set of solder pads 124. As such, the second stiffening member 134 may be configured to provide structural integrity to the FPC 100 when a corresponding set of external wires are being hotbar soldered to the second set of solder pads 124.

It should be appreciated that, in general, the stiffening members 132, 134 may be formed from any suitable rigid or stiff material that is configured to provide stiffness to the circuit body 100 in the proximity of the soldering areas 116, 118 when hotbar soldering external wires to the solder pads 122, 124. However, in a specific embodiment, the stiffening members 132, 134 may be formed from a given metal material, such as stainless steel or any other suitable metal or metal alloy.

Figure 3:
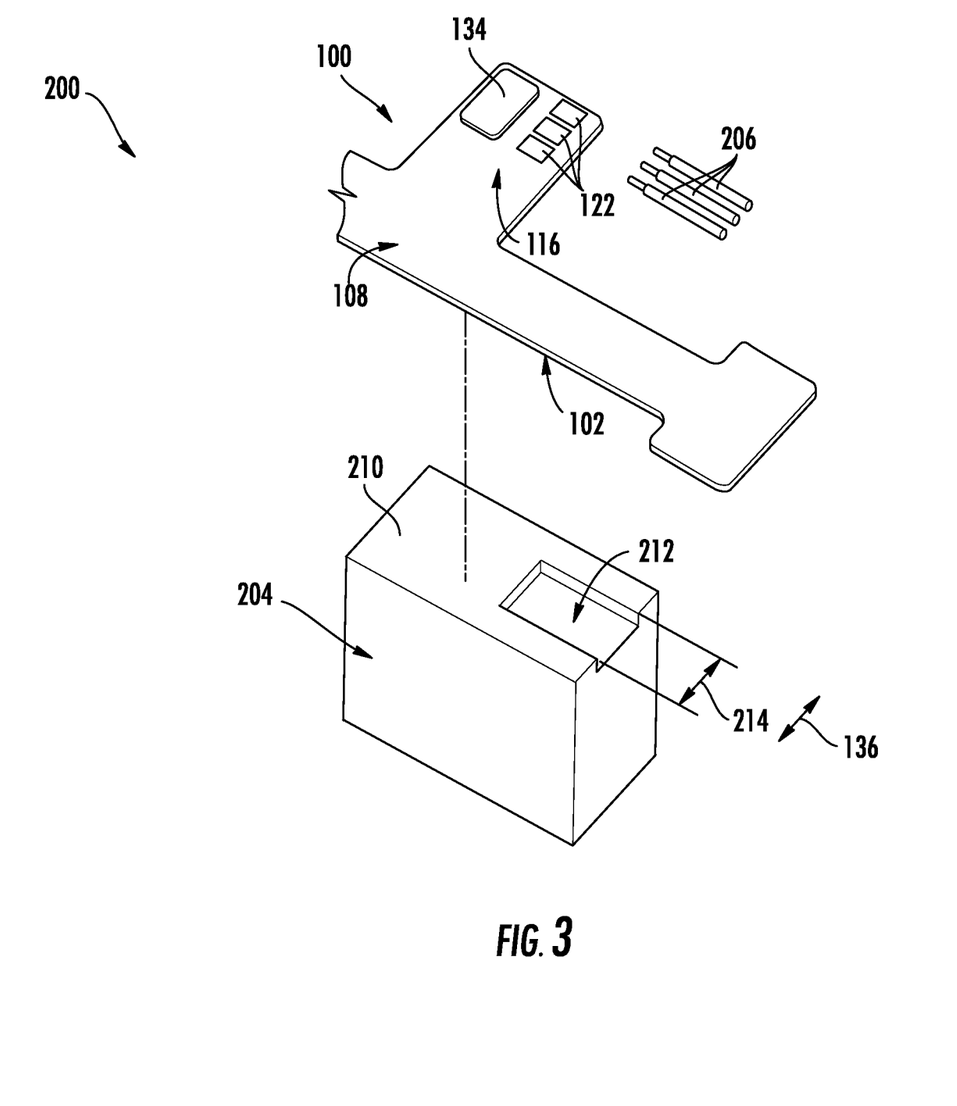
FIG. 3 illustrates a perspective, exploded view of various components of a system for hotbar soldering a dual-sided flexible printed circuit assembly in accordance with aspects of the present subject matter, particularly illustrating a portion of the flexible printed circuit shown in FIGS. 1A-2B exploded away from a soldering fixture of the system and a first set of wires exploded away from the flexible printed circuit.
Figure 4:
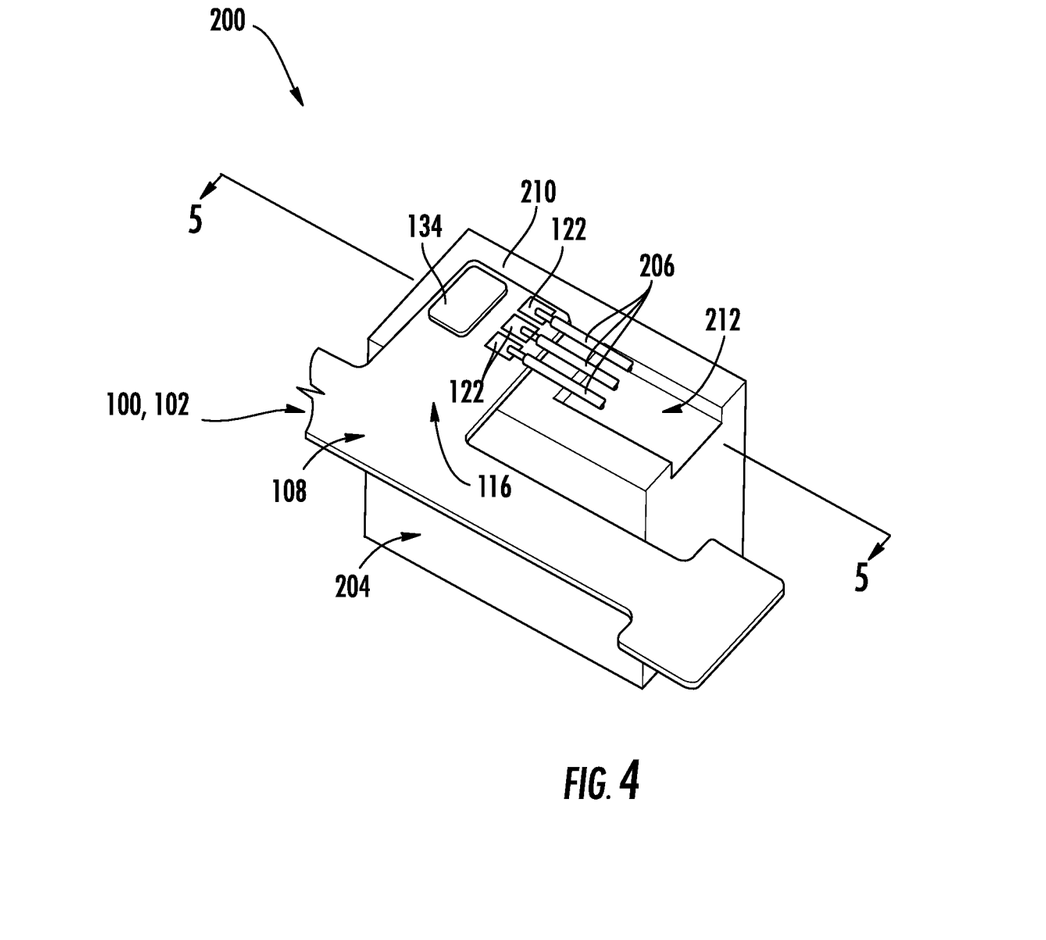
FIG. 4 illustrates a perspective view of the various system components shown in FIG. 3 installed relative to one another.
Figure 5:
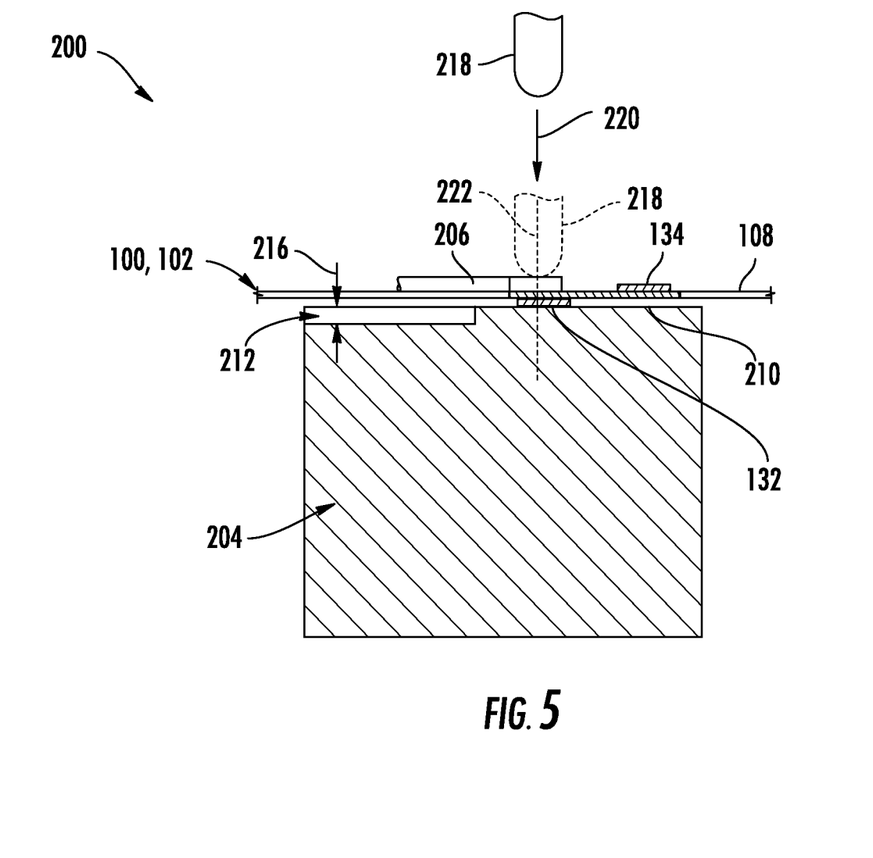
FIG. 5 illustrates a cross-sectional view of the system components shown in FIG. 4 taken about line 5-5.
Figure 6:
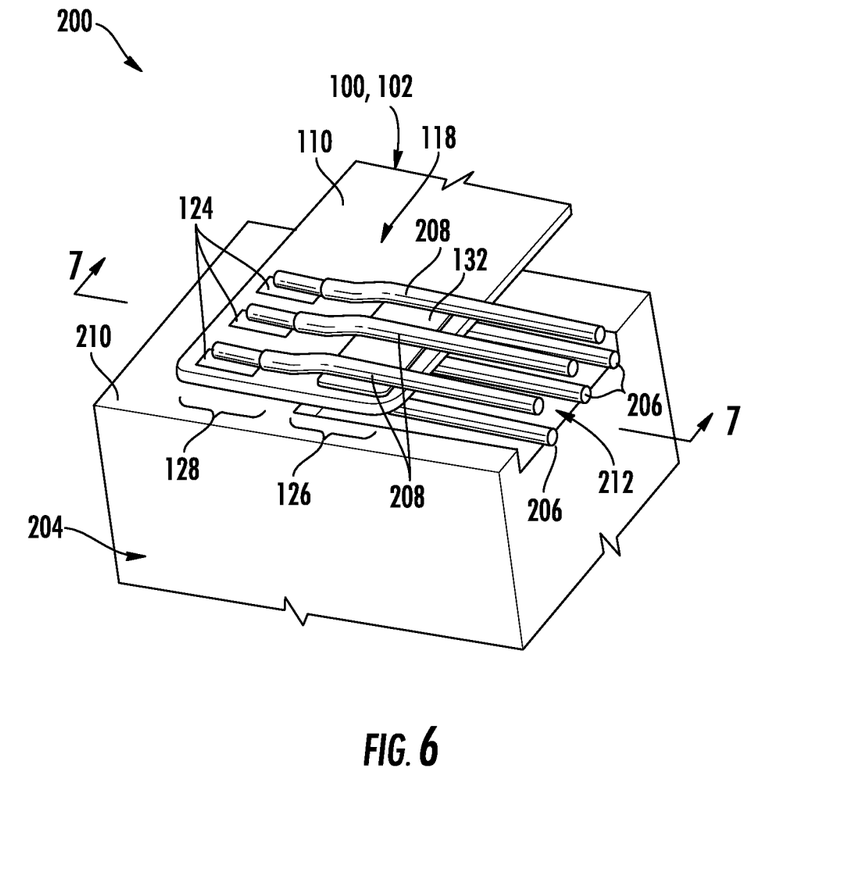
FIG. 6 illustrates another perspective view of the system components shown in FIG. 4 with the flexible printed circuit being flipped over relative to the soldering fixture and a second set of wires being installed relative to the flexible printed circuit.
Figure 7:
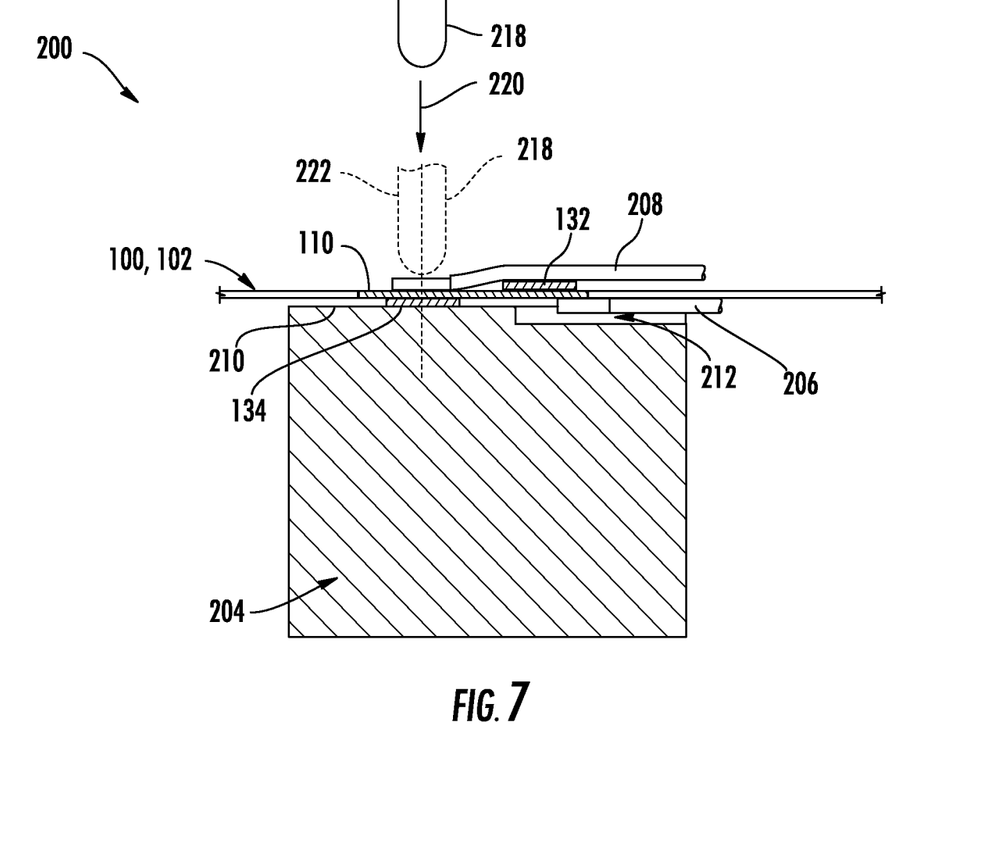
FIG. 7 illustrates a cross-sectional view of the system components shown in FIG. 6 taken about line 7-7.
Figure 8:
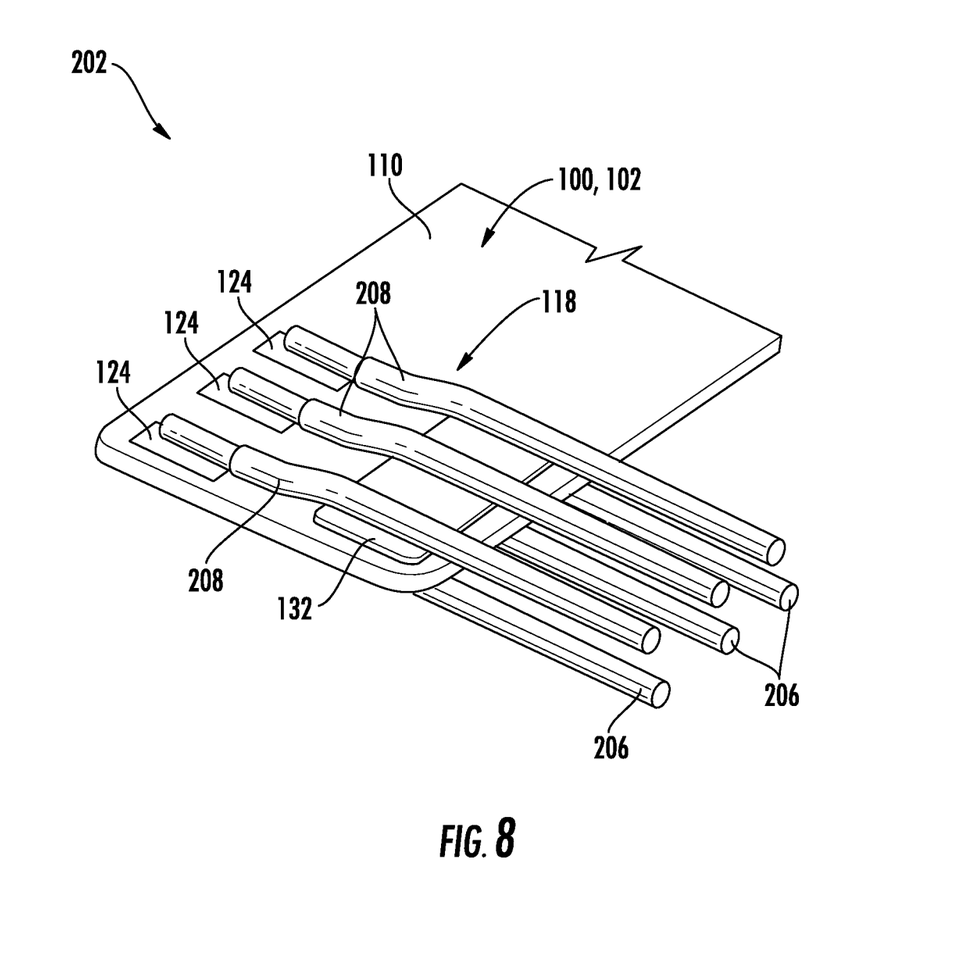
FIG. 8 illustrates an assembled, perspective view of one embodiment of a dual-sided flexible printed circuit assembly in accordance with aspects of the present subject matter.

Referring now to FIGS. 3-8, one embodiment of a system and an associated method for hotbar soldering a FPC assembly 202 (FIG. 8) will be described in accordance with aspects of the present subject matter. Specifically, FIG. 3 illustrates a perspective view of components of one embodiment of a FPC assembly 202 (FIG. 8) exploded away from a soldering fixture 204, with the assembly components including the FPC 100 described above with reference to FIGS. 1A-2B and a first set of wires 206. FIG. 4 illustrates the assembly components shown in FIG. 3 installed onto the soldering fixture 204 and FIG. 5 illustrates a cross-sectional view of the assembly components and the soldering fixture 204 shown in FIG. 4 taken about line 5-5. FIG. 6 illustrates a similar view to that shown in FIG. 4 with the FPC 100 being flipped over relative to the fixture 204 and a second set of wires 208 being installed relative to the FPC 100. FIG. 7 illustrates a cross-sectional view of the assembly components and the soldering fixture 204 shown in FIG. 6 taken about line 7-7. Additionally, FIG. 8 illustrates a partial, perspective view of one embodiment of a fully assembled FPC assembly 202 in accordance with aspects of the present subject matter.

As particularly shown in FIG. 3, the soldering fixture 204 may define a support surface 210 for supporting the circuit body 102 of the FPC 100 when using the fixture 204 to hotbar solder a plurality of wires (e.g., a first set of wires 206 (FIG. 3) and a second set of wires 208 (FIG. 6)) to the FPC 100. For instance, the circuit body 102 may be configured to be positioned relative to the fixture 204 such that the soldering areas 116, 118 defined along the first and second sides 108, 110 of the circuit body 102 are positioned directly over the support surface 210 and the stiffening member 132, 134 provided on the side of the circuit body 102 closest to the fixture 204 directly contacts the support surface 210. Additionally, as shown in FIG. 3, the fixture 204 may define a recessed channel 212 that is recessed relative to the support surface 210. As will be described below, the recessed channel 212 may serve as a wire receiving area of the fixture 204 when hotbar soldering wires to the opposed side of the circuit body 102. Thus, in several embodiments, the recessed channel 212 may define suitable dimensions for receiving the wires 206, 208 configured to be soldered to one or both of the sides 108, 110 of the circuit body 102. For instance, in one embodiment, the recessed channel 212 may be configured to define a lateral dimension 214 (FIG. 3) in the first lateral direction 136 that is greater than the first lateral dimensions 144, 152 defined by the first and second sets of solder pads 122, 124. In addition, in one embodiment, the recessed channel 112 may be configured to define a channel depth 216 (FIG. 5) that is greater than a corresponding depth or diameter of the wires 206, 208.

As particularly shown in FIGS. 3 and 4, to solder the first set of wires 206 to the first side 108 of the circuit body 102, the FPC 100 may be installed onto the fixture 204 such that the second side 110 of the circuit body 102 is facing towards the fixture 204 and the first stiffening member 132 is in direct contact with the support surface 210. As shown in FIG. 4, the first set of wires 206 may then be positioned relative to the FPC 100 such that an end of each wire 206 is aligned within one of the solder pads of the first set of solder pads 122. Thereafter, as shown in FIG. 5, a suitable hotbar or thermode 218 may be moved downward onto the ends of the wires 206 (e.g., as indicated by the dashed lines) such that the wires 206 and the FPC 100 are compressed between the thermode 218 and the support surface 210 of the fixture 204. In doing so, given that the first stiffening member 132 is laterally aligned with the first set of solder pads 122, the first stiffening member 132 may be positioned directly in line with the thermode 218 so that the compressive force (e.g., as indicated by arrow 220) applied by the thermode 218 passes through the stiffening member 132. For instance, as shown in FIG. 5, the compressive force 220 may be applied by the thermode 218 along a vertical plane 222 that passes through the first stiffening member 132. As is generally understood, once the thermode 218 is lowered down onto the ends of the wires 206, the thermode 218 may be heated such that thermal energy is transferred to the ends of the wires 206 and the solder contained within each of the first set of solder pads 112. As the solder melts, a solder joint may be created between the first set of wires 206 and the circuit body 102 at the location of the first set of solder pads 122.

Referring particularly to FIGS. 6 and 7, after soldering the first set of wires 206 to the first side 108 of the circuit body 00, the FPC 100 may be flipped over relative to the fixture 204 such that its second side 110 is facing upwardly. The FPC 100 may then be re-installed back onto the fixture 204 so that the first side 108 of the circuit body 102 is facing towards the fixture 204 and the second stiffening member 134 is in direct contact with the support surface 210. As shown in FIGS. 6 and 7, when installing the FPC 100 onto the fixture 204 post-soldering of the first set of wires 206, the FPC 100 may be laterally positioned relative to the fixture 204 in a manner that allows the first set of wires 206 to be received within the recessed channel 212. For instance, as particularly shown in FIG. 6, the FPC 100 may be positioned on the fixture 204 such that the first lateral portion 126 of the soldering areas 116, 118 defined by the circuit body 102 is positioned directly over the recessed channel 212, thereby allowing the first set of wires 206 to extend within the recessed channel 212. In such an embodiment, the second lateral portion 128 of the soldering areas 116, 118 defined by the circuit body 102 may be configured to be positioned directly over the support surface 210 to allow the second stiffening member 134 to be in direct contact with the surface 210.

As shown in FIG. 6, upon properly positioning the FPC 100 relative to the fixture 204, the second set of wires 208 may then be positioned relative to the FPC 100 such that an end of each wire 208 is aligned within one of the solder pads of the second set of solder pads 124. Thereafter, as shown in FIG. 7, the thermode 218 may be moved downward onto the ends of the wires 208 (e.g., as indicated by the dashed lines) such that the wires 208 and the FPC 100 are compressed between the thermode 218 and the support surface 210 of the fixture 204. In doing so, given that the second stiffening member 134 is laterally aligned with the second set of solder pads 124, the second stiffening member 134 may be positioned directly in line with the thermode 218 so that the compressive force 220 applied by the thermode 218 passes through the stiffening member 134. For instance, as shown in FIG. 7, the compressive force 220 may be applied by the thermode 218 along a vertical plane 222 that passes through the second stiffening member 134. As is generally understood, once the thermode 218 is lowered down onto the ends of the wires 208, the thermode 218 may be heated such that thermal energy is transferred to the ends of the wires 208 and the solder contained within each of the second set of solder pads 124. As the solder melts, a solder joint may be created between the second set of wires 208 and the circuit body 102 at the location of the second set of solder pads 124.

As shown in FIG. 8, upon soldering the second set of wires 208 to the circuit body 102, the soldered FPC assembly 202 may include the FPC 100, the first set of wires 206, and the second set of wires 208, with the first set of wires 206 being secured to the first side 108 of the circuit body 102 and the second set of wires 208 being secured to the second side 110 of the circuit body 102. In such an embodiment, when both sets of wires 206, 208 are configured to extend from the FPC 100 in the same direction, one of the sets of wires 206, 208 may extend over the stiffening member 132, 134 secured onto the same side of the circuit body 102. For instance, as shown in FIG. 8, the second set of wires 208 may be configured to extend from the second set of solder pads 124 and pass over the first stiffening member 132 to allow both sets of wires 206 207 to extend from the FPC 100 in the same direction (e.g., in the direction of arrow 224).

Figure 9:
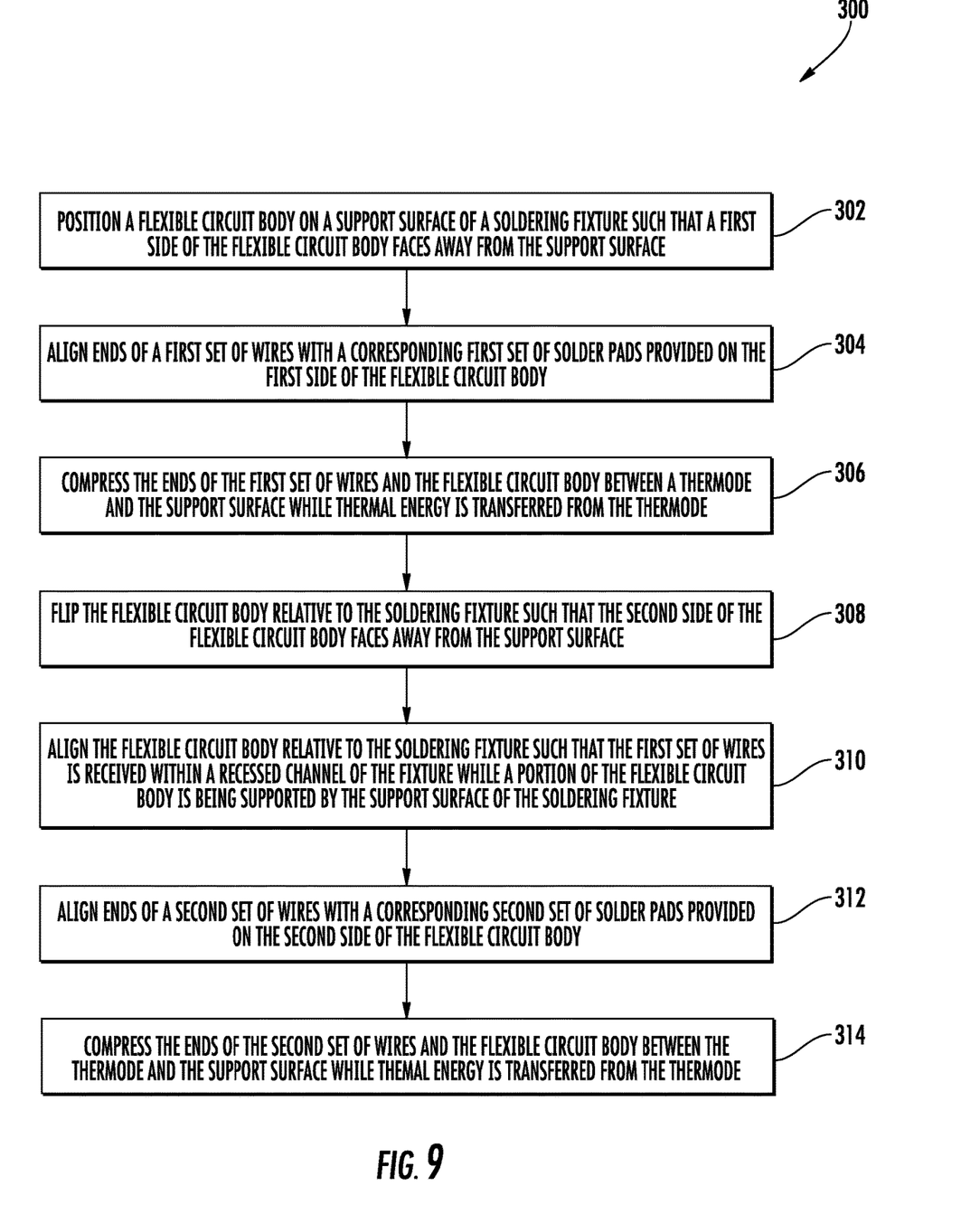
FIG. 9 illustrates a flow diagram of one embodiment of a method for hotbar soldering dual-sided, flexible printed circuit assemblies in accordance with aspects of the present subject matter.

Referring now to FIG. 9, a flow diagram of one embodiment of a method 300 for hotbar soldering flexible printed circuit assemblies is illustrated in accordance with aspects of the present subject matter. In general, the method 300 will be described herein with reference to the embodiment of the FPC 100 and the system 200 described above with reference to FIGS. 1A-8. However, it should be appreciated by those of ordinary skill in the art that the disclosed method 300 may generally be implemented with any FPC having any suitable circuit configuration and/or any suitable have any suitable system configuration. In addition, although FIG. 9 depicts steps performed in a particular order for purposes of illustration and discussion, the methods discussed herein are not limited to any particular order or arrangement. One skilled in the art, using the disclosures provided herein, will appreciate that various steps of the methods disclosed herein can be omitted, rearranged, combined, and/or adapted in various ways without deviating from the scope of the present disclosure.

As shown in FIG. 9, at (302), the method 300 may include positioning a flexible circuit body on a support surface of a soldering fixture such that a first side of the flexible circuit body faces away from the support surface. Specifically, as indicated above, the FPC 100 may be positioned on the support surface 210 of the fixture 204 such that the first side 108 of the circuit body 102 faces away from the support surface 210 and a second side 110 of the circuit body 102 faces towards the support surface 210. Additionally, when the FPC is positioned on the support surface 210, the first stiffening member 132 may be configured to directly contact the support surface 210.

Additionally, at (304), the method 300 may include aligning ends of a first set of wires with a corresponding first set of solder pads provided on the first side of the flexible circuit body. Thereafter, at (306), the method 300 may include compressing the ends of the first set of wires and the circuit body between a thermode and the support surface of the fixture while thermal energy is transferred from the thermode. Specifically, as indicated above, the thermode 218 may be pressed against the ends of the first set of wires 206 and heated to create a solder joint between the wires 206 and the circuit body 102. In doing so, the first stiffening member 132 may provide structural support for the circuit body 102 as the compressive force 220 is being applied by the thermode 218.

Moreover, at (306), the method 300 may include flipping the flexible circuit body relative to the soldering fixture such that the second side of the flexible circuit body faces away from the support surface. Specifically, as indicated above, the FPC 100 may be flipped relative to the fixture 204 such that the second side 110 of the circuit body 102 faces away from the support surface 210 and the first side 108 of the circuit body 102 faces towards the support surface 210. Additionally, upon flipping the FPC 100 and placing it back on the fixture 204, the second stiffening member 134 may be configured to directly contact the support surface 210.

Referring still to FIG. 9, at (308), the method 300 may include aligning the flexible circuit body relative to the soldering fixture such that the first set of wires is received within a recessed channel of the fixture while a portion of the flexible circuit body is being supported by the support surface of the soldering fixture. Specifically, as indicated above, the FPC 100 may be positioned on the fixture 204 such that the first lateral portion 126 of the soldering areas 116, 118 defined by the circuit body 102 is positioned directly over the recessed channel 212, thereby allowing the first set of wires 206 to extend within the recessed channel 212. In such an embodiment, the second lateral portion 128 of the soldering areas 116, 118 defined by the circuit body 102 may be positioned directly over the support surface 210 to allow the second stiffening member 134 to be in direct contact with the surface 210.

Additionally, at (310), the method 300 may include aligning ends of a second set of wires with a corresponding second set of solder pads provided on the second side of the flexible circuit body. Moreover, at (312), the method 300 may include compress the ends of the second set of wires and the flexible circuit body between the thermode and the support surface while thermal energy is transferred from the thermode. Specifically, as indicated above, the thermode 218 may be pressed against the ends of the second set of wires 208 and heated to create a solder joint between the wires 208 and the circuit body 102. In doing so, the second stiffening member 134 may provide structural support for the circuit body 102 as the compressive force 220 is being applied by the thermode 218.

While the present subject matter has been described in detail with respect to specific exemplary embodiments and methods thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A flexible printed circuit assembly, comprising:
    a flexible circuit body defining a first lateral direction and a second lateral direction that are orthogonal to one another, the flexible circuit body including a first side and an opposed second side elongated in the first lateral direction and the second lateral direction and separated from one another by a thickness in a direction orthogonal to the first lateral direction and the second lateral direction, the flexible circuit body defining a first soldering area along the first side of the flexible circuit body and a second soldering area along the second side of the flexible circuit body, the first soldering area including a first set of solder pads and the second soldering area including a second set of solder pads;
    a first stiffening member secured to the second side of the flexible circuit body, the first stiffening member being laterally aligned in at least the first lateral direction with the first set of solder pads defined on the first side of the flexible circuit body and being laterally offset in at least the first lateral direction from the second set of solder pads defined on the second side of the flexible circuit body;
    a second stiffening member secured to the first side of the flexible circuit body, the second stiffening member being laterally aligned with the second set of solder pads defined on the second side of the flexible circuitry body and being laterally offset in at least the first direction from the first set of solder pads defined on the first side of the flexible circuit body; and
    at least one wire secured to the flexible circuit body at the first set of solder pads and elongated in the first lateral direction across the second stiffening member.

2. The flexible printed circuit assembly of claim 1, wherein the first and second stiffening members are laterally offset relative to each other.

3. The flexible printed circuit assembly of claim 1, wherein the first set of solder pads is laterally offset from the second set of solder pads by a minimum lateral offset distance.

4. The flexible printed circuit assembly of claim 1, further comprising:
    a first set of wires including the at least one wire secured to the flexible circuit body at the first set of solder pads; and
    a second set of wires secured to the flexible circuit body at the second set of solder pads.

5. The flexible printed circuit assembly of claim 1, wherein the first and second stiffening members are formed from a rigid material.

6. The flexible printed circuit assembly of claim 5, wherein the rigid material comprises stainless steel.

7. The flexible printed circuit assembly of claim 1, wherein the first stiffening member defines lateral dimensions that are greater than corresponding lateral dimensions of an area encompassed by the first set of solder pads and wherein the second stiffening member defines lateral dimensions that are greater than corresponding lateral dimensions of an area encompassed by the second set of solder pads.

8. A system for hotbar soldering flexible printed circuit assemblies, the system comprising:
    a soldering fixture defining a support surface, the soldering fixture further defining a recessed channel that is recessed relative to the support surface;

a flexible circuit body including a first side and an opposed second side, the flexible circuit body defining a first soldering area along the first side of the flexible circuit body and a second soldering area along the second side of the flexible circuit body, the first soldering area including a first set of solder pads and the second soldering area including a second set of solder pads;

a first stiffening member secured to the second side of the flexible circuit body, the first stiffening member being laterally aligned with the first set of solder pads defined on the first side of the flexible circuit body;

a second stiffening member secured to the first side of the flexible circuit body, the second stiffening member being laterally aligned with the second set of solder pads defined on the second side of the flexible circuit body, wherein the first and second stiffening members are laterally offset relative to each other;

a first set of wires secured to the flexible circuit body at the first set of solder pads; and a second set of wires secured to the flexible circuit body at the second set of solder pads, wherein, when the flexible circuit body is supported on the support surface of the soldering fixture such that the first side of the flexible circuit body faces towards the support surface and the second side of the flexible circuit body faces away from the support surface, the first set of wires are received within the recessed channel of the soldering fixture.

9. The system of claim 8, wherein the second stiffening member is in direct contact with the support surface when the first set of wires is received within the recessed channel of the soldering fixture.

10. The system of claim 8, wherein the first and second stiffening members are formed from a rigid material.

11. The system of claim 10, wherein the rigid material comprises stainless steel.

12. The system of claim 8, wherein the first stiffening member defines lateral dimensions that are greater than corresponding lateral dimensions of an area encompassed by the first set of solder pads and wherein the second stiffening member defines lateral dimensions that are greater than corresponding lateral dimensions of an area encompassed by the second set of solder pads.

13. A method for hotbar soldering flexible printed circuit assemblies, the method comprising:

positioning a flexible circuit body on a support surface of a soldering fixture such that a first side of the flexible circuit body faces away from the support surface and a second side of the flexible circuit body faces towards the support surface, the soldering fixture defining a recessed channel that is recessed relative to the support surface;

aligning ends of a first set of wires with a corresponding first set of solder pads provided on the first side of the flexible circuit body;

compressing the ends of the first set of wires and the flexible circuit body between a thermode and the support surface while thermal energy is transferred from the thermode to the first set of wires and the first set of solder pads to secure the first set of wires to the first side of the flexible circuit body at the first set of solder pads;

flipping the flexible circuit body relative to the soldering fixture such that the second side of the flexible circuit body faces away from the support surface and the first side of the flexible circuit body faces towards the support surface; and aligning the flexible circuit body relative to the soldering fixture such that the first set of wires is received within the recessed channel while a portion of the flexible circuit body is being supported by the support surface of the soldering fixture.

14. The method of claim 13, further comprising:

aligning ends of a second set of wires with a corresponding second set of solder pads provided on the second side of the flexible circuit body; and with the first set of wires being received within the recessed channel, compressing the ends of the second set of wires and the flexible circuit body between the thermode and the support surface while thermal energy is transferred from the thermode to the second set of wires and the second set of solder pads to secure the second set of wires to the second side of the flexible circuit body.

15. The method of claim 13, wherein the flexible circuit body includes:

a first stiffening member secured to the second side of the flexible circuit body, the first stiffening member being laterally aligned with the first set of solder pads defined on the first side of the flexible circuit body; and a second stiffening member secured to the first side of the flexible circuit body, the second stiffening member being laterally aligned with the second set of solder pads defined on the second side of the flexible circuit body.

16. The method of claim 15, wherein aligning the flexible circuit body relative to the soldering fixture comprises aligning the flexible circuit body relative to the soldering fixture such that the first set of wires is received within the recessed channel while the second stiffening member is in direct contact with the support surface of the soldering fixture.

17. The method of claim 15, wherein compressing the ends of the first set of wires and the flexible circuit body between a thermode and the support surface comprises applying a compressive force through the ends of the first set of wires and the flexible circuit body along a vertical plane that passes through the first stiffening member.

18. The method of claim 15, wherein the first and second stiffening members are laterally offset relative to each other.

* * * * *